US 8,548,781 B2

(12) United States Patent
Pashnik et al.

(10) Patent No.: US 8,548,781 B2
(45) Date of Patent: Oct. 1, 2013

(54) METHOD AND SYSTEM FOR DETERMINING A VOLUME OF A VEHICLE COMPONENT AND THE DISPOSITION AND CONNECTEDNESS OF SUBCOMPONENTS THEREIN

(75) Inventors: Richard A. Pashnik, Saline, MI (US); David Wilkinson, Rochester Hills, MI (US); Gregory Chessky, Walled Lake, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 167 days.

(21) Appl. No.: 12/987,499

(22) Filed: Jan. 10, 2011

(65) Prior Publication Data
US 2012/0179442 A1 Jul. 12, 2012

(51) Int. Cl.
*G06G 7/50* (2006.01)

(52) U.S. Cl.
USPC ................................. 703/9; 703/8

(58) Field of Classification Search
USPC ........................................... 703/6–9
See application file for complete search history.

(56) References Cited

PUBLICATIONS

ANSYS, TGrid 5.0 User's Guide, Apr. 2008.*
Schoonmaker S., The CAD Guidebook : A Basic Manual for Understanding and Improving Computer-Aided Design [e-book]. Marcel Dekker; 2003. Available from: eBook Collection (EBSCOhost), Ipswich, MA, pp. (cover) 15, 170, 219.*
Sovani, Sandeep, "CFD Applications in the Automotive Industry", presentation from Fluent Roadshow, Shanghai and Beijing, Jun. 2006.*

* cited by examiner

*Primary Examiner* — Omar Fernandez Rivas
*Assistant Examiner* — Robert Brock
(74) *Attorney, Agent, or Firm* — Quinn Law Group, PLLC

(57) ABSTRACT

A method and system of determining a volume of a vehicle component. The system includes a computing device having a host application and analytical tool. The host application is configured to present an interface to a user and allow the user to modify a component model. The component model includes a three-dimensional representation of at least a portion of a vehicle component and has a virtual housing at least partially defining an internal cavity. The analytical tool is configured to generate a solid body representing the internal cavity and calculate a volume of the solid body. The analytical tool is configured to determine whether the internal cavity is bounded by the virtual housing, counting a number of external and internal faces traversed by the fluid during the simulated fluid flow, and determining a shortest path between the selected external and internal faces.

13 Claims, 3 Drawing Sheets

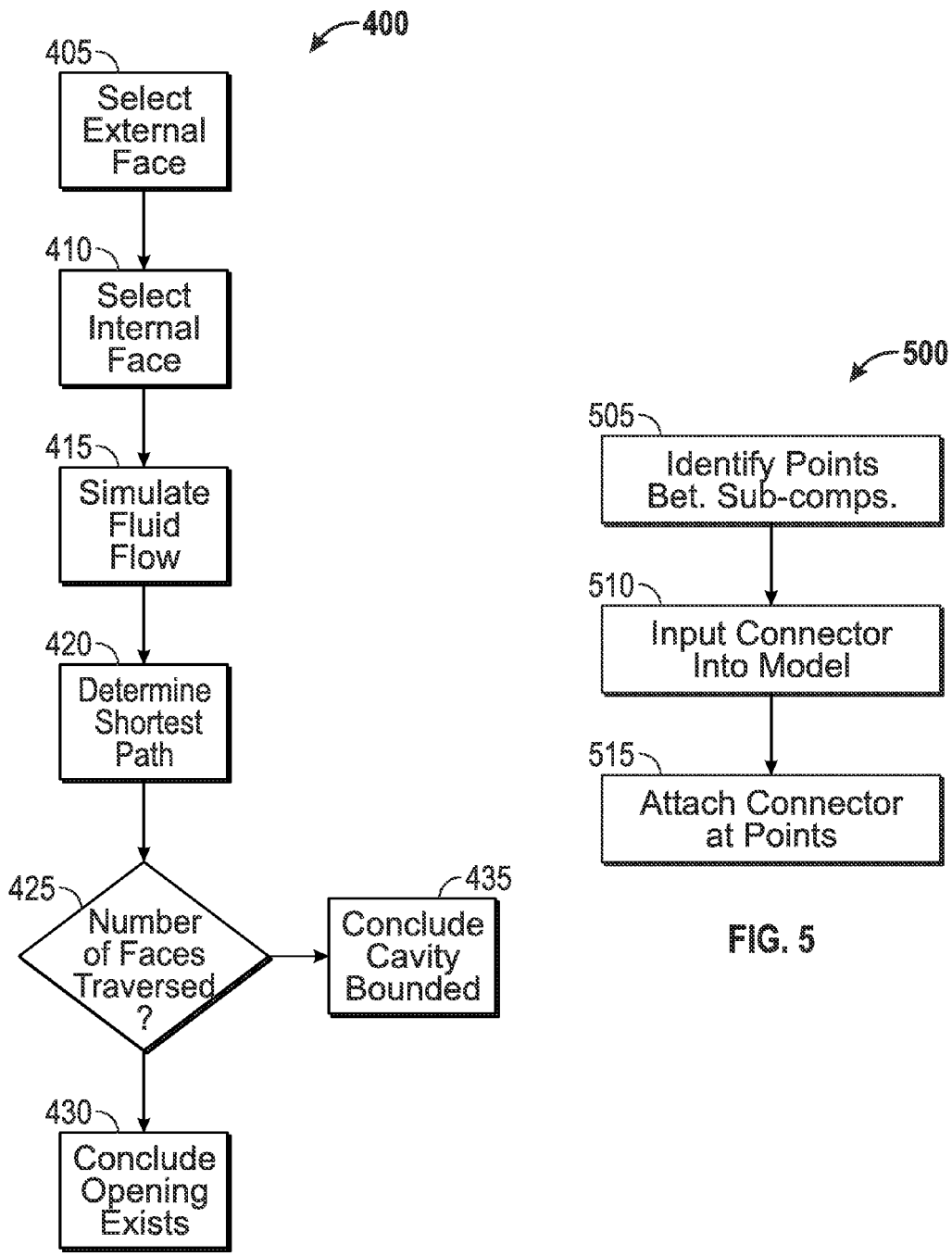

METHOD AND SYSTEM FOR DETERMINING A VOLUME OF A VEHICLE COMPONENT AND THE DISPOSITION AND CONNECTEDNESS OF SUBCOMPONENTS THEREIN

TECHNICAL FIELD

The disclosure relates to a volume analysis of an internal cavity of a component.

BACKGROUND

Passenger and commercial vehicles may have various components that may be modeled using software prior to manufacturing the component. In particular, an engineer may use the software to design a virtual representation of the physical characteristics of one or more vehicle components. Moreover, the software may allow the engineer to view the way the components interact with one another in a virtual environment.

SUMMARY

An example computing device includes a host application and an analytical tool. The host application is configured to present an interface to a user and allow the user to modify a component model. The component model includes a three-dimensional representation of at least a portion of a vehicle component and has a virtual housing at least partially defining an internal cavity. The analytical tool is configured to generate a solid body representing the internal cavity and calculate a volume of the solid body. The analytical tool is further configured to determine whether the internal cavity is bounded by the virtual housing of the component model.

An example method of determining a volume of a vehicle component includes loading a component model into a host application, determining whether the internal cavity is bounded by the virtual housing, and generating a solid body representing the internal cavity if the internal cavity is bounded by the virtual housing. Further, the method includes determining a volume of the solid body.

BRIEF DESCRIPTION OF THE DRAWINGS

FIG. 4 illustrates a flowchart of an example process that may be implemented by the computing device to determine whether an internal cavity is bounded by a housing of the vehicle component as represented by the component model.

FIG. 5 illustrates a flowchart of an example process that may be implemented by the computing device to connect subcomponents of a component model.

DETAILED DESCRIPTION

Figure 1:
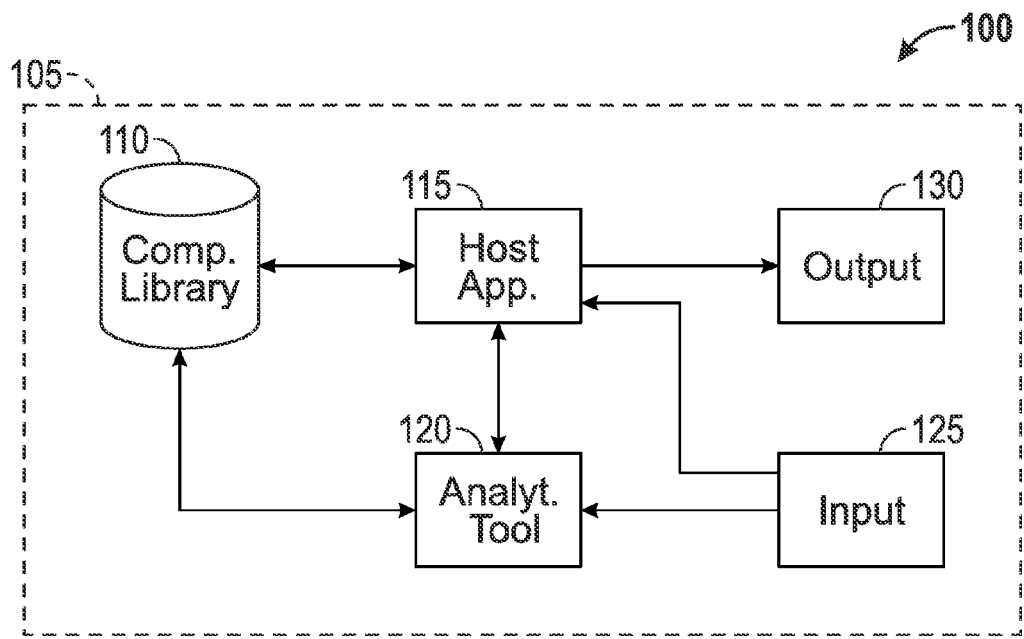
FIG. 1 is a schematic diagram of an example system configured to determine a volume of fluid used within a vehicle component.

FIG. 1 illustrates a system 100 that is able to determine an amount of fluid (e.g., oil, coolant, air, etc.) used by various vehicle components based on a component model. The system 100 may take many different forms and include multiple and/or alternate components and facilities. While an example system 100 is shown in the Figures, the components illustrated in the Figures are not intended to be limiting. Indeed, additional or alternative components and/or implementations may be used.

The system 100 may include a computing device 105 configured to access a component library 110 and execute a host application 115 and an analytical tool 120. The system 100 may be used to design and model components that may be implemented in any passenger or commercial automobile such as a hybrid electric vehicle including a plug-in hybrid electric vehicle (PHEV) or an extended range electric vehicle (EREV), a gas-powered vehicle, a battery electric vehicle (BEV), or the like.

The computing device 105 may include an input device 125 and an output device 130 to interact with a user, such as a software engineer or developer, so that the user may design and generate computer models of various vehicle components. The input device 125 may include any device that allows the user to provide information or commands to the computing device 105. The input device 125 may include, for example, a computer mouse and/or keyboard. The output device 130 may include any device configured to present information to the user. Thus, the output device 130 may include a display screen or computer monitor, such as a liquid crystal display (LCD) screen.

The computing device 105 may be configured to employ any of a number of computer operating systems and generally include computer-executable instructions, where the instructions may be executable by one or more computers. Computer-executable instructions may be compiled or interpreted from computer programs created using a variety of well known programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

The component library 110 may include a database of component models 200, described in greater detail below with respect to FIG. 2. The component library 110 may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device (e.g., the same or different than the computing device 105 illustrated in FIG. 1) employing a computer operating system such as one of those mentioned above, and are accessed via a network in any one or more of a variety of manners. A file system may be accessible from a computer operating system, and may include files stored in various formats. An RDBMS may employ the known Structured Query Language (SQL) in addition to a language for creating, storing, editing, and executing stored procedures, such as the PL/SQL language mentioned above. In one possible approach, the component library 110 may be stored in an internal memory of the computing device 105. Alternatively, the component library 110 may be stored remotely from the computing device 105 and be in communication with the computing device 105 via a network.

Figure 2:
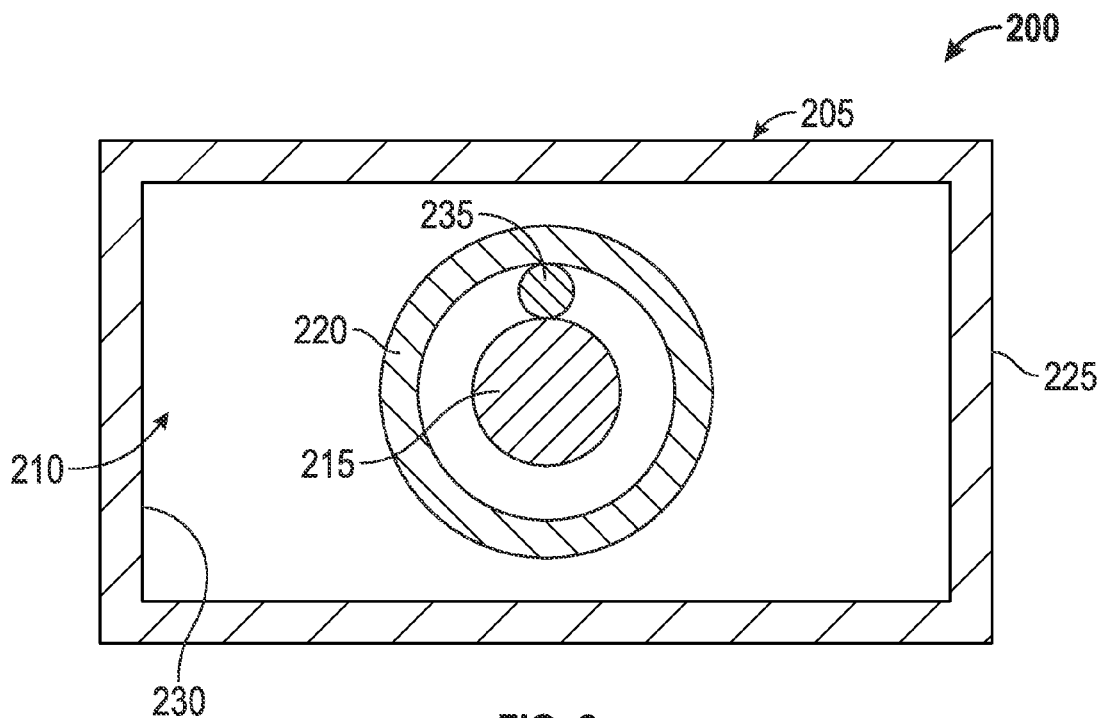
FIG. 2 is a schematic of a cross-sectional view of an example component model that may be used in the system of FIG. 1.

Referring now to FIG. 2, one or more of the component models 200 may include a three-dimensional representation of at least a portion of a vehicle component having a housing that at least partially defines an internal cavity. As such, the component model 200 includes a virtual representation of the housing (e.g., a virtual housing 205) and the internal cavity 210, as well as virtual representations of any other physical feature of the vehicle component, such as first and second subcomponents 215, 220, which may be connected via a connector 235, as described in greater detail below. The virtual housing 205 may have one or more external faces 225 representing the outer surface of the vehicle component. The internal cavity 210 may be used to represent the space within the virtual housing 205 that is used to hold or facilitate the flow of a fluid through the vehicle component. The internal cavity 210 may be defined by one or more internal faces 230, each representing a surface of the internal cavity 210. The component model 200 may include any number of subcomponents disposed within the virtual housing 205 that either define or at least partially define the internal cavity 210.

Referring back to FIG. 1, the host application 115 may include a computer-aided design (CAD) software application executed by the computing device 105 that may be used to generate and modify the component models 200 stored in the component library 110. In one possible approach, the host application 115 may present an interface to a user via the output device 130 so that the user may view one or more of the component models 200. The interface may further present the user with one or more tools that may be used to modify the component model 200. The user may select one or more of the tools using the input device 125. The host application 115 may be configured to execute commands based on the input from the user. Additionally, the host application 115 may be configured to prompt the user for information about the component model 200 via the output device 130. The user may respond to the prompt via the input device 125.

In one possible approach, the host application 115 may be configured to simulate the operation of the vehicle component using the component model 200, including the flow of fluid through the vehicle component. For instance, if the component model 200 represents a valve body used with a vehicle transmission, the host application 115 may be configured to simulate the flow of fluids through various portions of the component model 200 substantially similar to the way that fluid would flow through the actual valve body the component model 200 represents. This way, the user may test features of the vehicle component using the virtual representation of the vehicle component as defined by the component model 200.

The analytical tool 120 may be implemented via hardware, software, or a combination of both. In one possible approach, the analytical tool 120 may be a software module executed within the host application 115. Alternatively, the analytical tool 120 may be a software module that is executed by the computing device 105 separately from the host application 115. The user may be able to interact with the analytical tool 120 via the input device 125, and the analytical tool 120 may be configured to present information or prompts to the user via the output device 130.

The analytical tool 120 may be configured to generate a solid body representing the internal cavity 210 of the component model 200 and calculate a volume of the solid body. To the user, the solid body may resemble a "negative image" of the internal cavity 210. In other words, the solid body may look like a subcomponent that may be placed within the internal cavity 210 that fills the internal cavity 210. Using the analytical tool 120 the user may be able to determine how much fluid may be within the vehicle component that is modeled by the component model 200 during operation of the vehicle component. Prior to generating the solid body representing the internal cavity 210, the analytical tool 120 may be configured to determine whether the component model 200 accurately represents a vehicle component that may facilitate the flow of fluid (e.g., the component model 200 is sealed where necessary to prevent the fluid from leaking). Moreover, the analytical tool 120 may be configured to determine whether the location of various subcomponents, such as the first subcomponent and the second subcomponent 220, of the component model 200 may affect the configuration of the solid body and the volume calculation.

In one possible implementation, the analytical tool 120 may be configured to determine whether the internal cavity 210 is bounded (e.g., sealed) by the virtual housing 205 of the component model 200. That is, the analytical tool 120 may be configured to determine whether fluid within the internal cavity 210 can leak from the virtual housing 205. To do so, the analytical tool 120, or alternatively the host application 115, may prompt the user to select one of the external faces 225 of the virtual housing 205 and one of the internal faces 230 that defines the internal cavity 210. The analytical tool 120 may be configured to simulate or command the host application 115 to simulate a flow of fluid between the selected external faces 225 and internal faces 230. The analytical tool 120 may be configured to count a number of the external and/or internal faces 225, 230 traversed by the fluid during the simulated fluid flow, and identify a shortest path the fluid may travel between the selected external faces 225 and internal faces 230. If such a path exists (e.g., the number of faces traversed is greater than zero), fluid may escape from the internal cavity 210 and leak outside of the virtual housing 205. Thus, the analytical tool 120 may be configured to conclude that the internal cavity 210 is not bounded by the virtual housing 205. If, however, no such path exists (e.g., the number of faces traversed is zero), the analytical tool 120 may be configured to determine that the internal cavity 210 is bounded by the virtual housing 205.

The analytical tool 120 may be further configured to determine whether subcomponents of the component model 200, such as the first subcomponent 215 and the second subcomponent 220, are disposed on one another. Referring to FIGS. 1 and 2, during operation of the actual vehicle component, some subcomponents may float in the fluid relative to other subcomponents, and the analytical tool 120 may be configured to identify and account for those subcomponents that are not connected to any other subcomponents or the virtual housing 205 when generating the solid body. In the example presented in FIG. 2, the analytical tool 120 may be configured to determine whether the first subcomponent 215 is disposed on (e.g., touching) the second subcomponent 220. If not, the analytical tool 120 may determine that the first subcomponent 215 is floating relative to the second subcomponent 220. To account for the first subcomponent 215 in the generation of the solid body, and therefore in the calculation of the volume of the solid body, the analytical tool 120 may be configured to generate the connector 235 to connect the first and second subcomponents 215, 220. In one possible approach, the analytical tool 120 may be configured to generate the connector 235 to have a shape and size that is as small as possible to connect the first and second subcomponents 215, 220. For instance, the analytical tool 120 may be configured to identify the closest points between the first and second subcomponents 215, 220 and generate the connector 235 to connect the closest points. The analytical tool 120 may be configured to generate a connector 235 having any shape, such as a spherical shape.

Alternatively, multiple connectors 235 of various shapes and sizes may be stored in the component library 110, and the analytical tool 120 may be configured to find a suitable connector 235 in the component library 110 and place the connector 235 from the component library 110 onto the first subcomponent 215 in a way that connects the first subcomponent 215 to the second subcomponent 220. The analytical tool 120 may be configured to resize the connector 235 from the component library 110 as necessary to be as small as possible yet still connect the first and second subcomponents 215, 220. In other example approaches, the analytical tool 120 may be configured to select the appropriate connector 235 and allow the user to manually connect the first and second subcomponents 215, 220 using the selected connector 235, or allow the user to manually generate and place the connector 235 into the component model 200.

Figure 3:
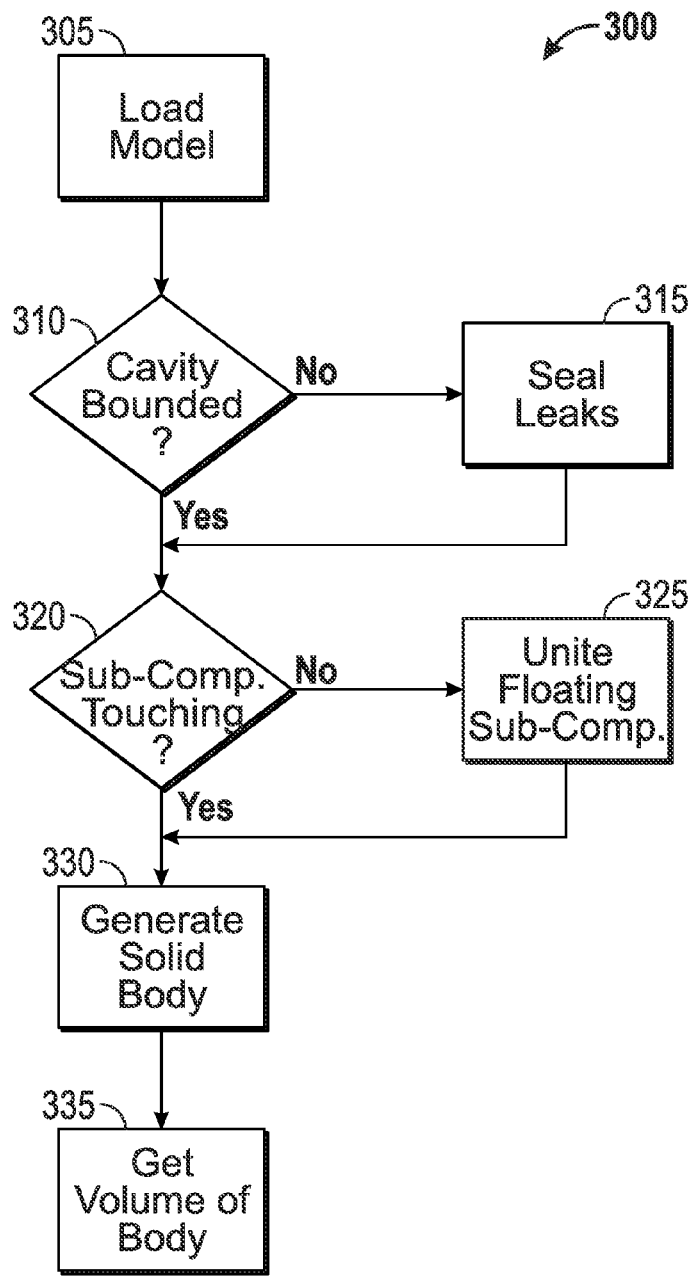
FIG. 3 illustrates a flowchart of an example process that may be used by the system to determine the volume of fluid used within the vehicle component based on a component model.

FIG. 3 illustrates a flowchart of an example process 300 that may be used by the system 100 to determine the volume of fluid used within the vehicle component based on the solid body generated by the analytical tool 120.

At block 305, the computing device 105 may load one or more component models 200 into the host application 115. For instance, using the input device 125, the user may select one or more of the component models 200 stored in the component library 110. The computing device 105 may access the component library 110 and load one or more of the component models 200 based on the selection from the user.

At decision block 310, the computing device 105 may determine whether the internal cavity 210 of the component model 200 selected at block 305 is bounded by the virtual housing 205. For example, the analytical tool 120 may analyze the virtual housing 205 as presented in the component model 200 and identify places (e.g., holes or openings) in the virtual housing 205 that may allow fluid to leak. One way for the computing device 105 to determine whether the internal cavity 210 is bounded by the virtual housing 205 is described in greater detail below with respect to FIG. 4. Nevertheless, if the analytical tool 120 identifies one or more leaks in the virtual housing 205, the process 300 may continue at block 315. If not, the process 300 may continue at block 320.

At block 315, the computing device 105 may seal the leaks in the virtual housing 205 identified at block 310. In one possible approach, the computing device 105 may prompt and/or allow the user to manually edit the configuration of the virtual housing 205 to eliminate any leaks. Alternatively, the analytical tool 120 may be configured to determine the size of the hole or opening identified as causing the leak, generate a filler having a size and shape configured to plug the leak, and place the filler onto the virtual housing 205 in a way that would prevent the fluid from leaking. In one possible implementation, the analytical tool 120 may interact with the host application 115 to generate and place the filler onto the virtual housing 205.

At decision block 320, the analytical tool 120 may determine whether each of the subcomponents, such as the first and second subcomponents 215, 220, are touching one another or the virtual housing 205. This way, the analytical tool 120 may determine whether any subcomponents are floating relative to one another or the virtual housing 205. If the analytical tool 120 determines that at least one subcomponent is floating relative to another subcomponent or the virtual housing 205, the process 300 may continue at block 325. If, however, each subcomponent is disposed on either another subcomponent or the virtual housing 205, the process 300 may continue at block 330. One way for the analytical tool 120 to make such a determination is described at the process 500 below with reference to FIG. 5.

At block 325, the analytical tool 120 may unite each of the floating subcomponents with the virtual housing 205 or a subcomponent that is disposed on the virtual housing 205. For instance, the analytical tool 120 may generate the connector 235 as described in greater detail below with respect to the process 500 illustrated in FIG. 5.

At block 330, the analytical tool 120 may generate the solid body representing the internal cavity 210. For instance, the analytical tool 120 may interact with the host application 115 to generate a virtual representation of a piece that would completely fill the internal cavity 210. Since the internal cavity 210 was determined at block 310 to be bounded by the virtual housing 205, the solid body may be a virtual representation of all of the fluid that may be contained within the internal cavity 210 of the vehicle component.

At block 335, the analytical tool 120 may determine the volume of the solid body. As discussed above, the solid body may be a virtual representation of all of the fluid that may be contained within the internal cavity 210 of the vehicle component. Accordingly, the volume of the solid body may be substantially equal to the volume of the fluid that may be contained within the internal cavity 210 of the vehicle component.

FIG. 4 illustrates a flowchart of an example process 400 that may be implemented by the computing device 105 to determine whether the internal cavity 210 of the component model 200 is bounded by the virtual housing 205.

At block 405, the analytical tool 120 may prompt the user to select at least one external face 225 of the virtual housing 205. For instance, the analytical tool 120, either directly or through the host application 115, may generate a message requesting that the user select at least one of the external faces 225 of the virtual housing 205. The message may be presented to the user via the output device 130, and the user may make the selection using the input device 125.

At block 410, the analytical tool 120 may prompt the user to select at least one internal face 230 of the component model 200 that at least partially defines the internal cavity 210. For instance, the analytical tool 120, either directly or through the host application 115, may generate a message requesting that the user select at least one of the internal faces 230. The message may be presented to the user via the output device 130, and the user may make the selection using the input device 125.

At block 415, the analytical tool 120 may simulate a flow of fluid between the selected external and internal faces 225, 230. During the simulation, the analytical tool 120 may allow fluid to flow through any holes or openings that give the fluid in the internal cavity 210 access to the external surface of the virtual housing 205. If such a hole or opening exists, the fluid will leak out of the internal cavity 210 during the simulation and define a path between the selected internal faces 230 and external faces 225.

At block 420, the analytical tool 120 may determine a shortest path the fluid may take between the selected external and internal faces 225, 230 based on, for instance, the number of external and internal faces 225, 230 the fluid traversed during the simulated fluid flow. For example, the analytical tool 120 may count the number of internal faces 230 and external faces 225 traversed by the fluid during the simulation and identify the path with the fewest number of faces traversed as the shortest path.

At decision block 425, the analytical tool 120 may determine whether the number of faces traversed by the fluid during the simulation identified at block 420 indicates that a hole or opening exists in the virtual housing 205 that would allow fluid to leak. For instance, the analytical tool 120 may determine that if the number of faces traversed is equal to zero, the analytical tool 120 may conclude that the internal cavity 210 is bounded by the virtual housing 205 as indicated at block 435, and the process 400 may continue at block 320 of FIG. 3. If, however, the analytical tool 120 determines that the number of faces traversed is greater than zero, the analytical tool 120 may conclude that a hole or opening exists as indicated at block 430 and the process 400 may continue with block 315 of FIG. 3.

FIG. 5 illustrates a flowchart of an example process 500 that may be implemented by the computing device 105 to unite (e.g., virtually connect) subcomponents of the component model 200 to one another to, for instance, increase the accuracy of the generation of the solid body, and therefore, the calculation of the volume of the solid body. The process 500 may be used, for instance, if a first subcomponent 215 floats within the component model 200 relative to a second subcomponent 220 and the virtual housing 205.

At block 505, the analytical tool 120 may be configured to identify the closest points between the first subcomponent 215 and the second subcomponent 220. For instance, the analytical tool 120 may identify the location in space where the first subcomponent 215 is disposed and the location in space where the second subcomponent 220 is disposed as presented in the component model 200. The analytical tool 120 may determine which portion of the first subcomponent 215 is closest to the second subcomponent 220 and select the closest points between the first and second subcomponents 215, 220 accordingly. Alternatively, the analytical tool 120 may identify the closest point between the first subcomponent 215 and the virtual housing 205 if, for example, the virtual housing 205 is closer to the first subcomponent 215 than the second subcomponent 220.

At block 510, the analytical tool 120 may generate or input a connector 235 into the component model 200 to connect the first and second subcomponents 215, 220 or the first subcomponent 215 and the virtual housing 205. For instance, the analytical tool 120 may, using the host application 115, create the connector 235 to have a size and shape that is able to connect the closest points identified at block 505. Alternatively, the analytical tool 120 may access the component library 110 and select a connector 235 having a size and shape that may be used to connect the first and second subcomponents 215, 220 or the first subcomponent 215 and the virtual housing 205. When placed within the component model 200 to connect the first and second subcomponents 215, 220 or the first subcomponent 215 and the virtual housing 205, the connector 235 may have a volume that reduces the volume of the internal cavity 210. Therefore, in one possible approach, the analytical tool 120 may generate or select the connector 235 that has as small of a volume as possible.

At block 515, the analytical tool 120 may virtually attach the connector 235 to the first and second components 215, 220 or the first subcomponent 215 and the virtual housing 205 at the closest points identified at block 505. Alternatively, the analytical tool 120 may generate the connector 235 as described at block 510 and allow the user to manually input the connector 235 into the component model 200 to connect the first and second subcomponents 215, 220 or the first subcomponent 215 and the virtual housing 205. Once connected, the analytical tool 120 may be able to account for the volume of the first subcomponent 215 (e.g., the subcomponent that floats with in the virtual housing 205) when generating the solid body and calculating the volume of fluid flow.

While the best modes for carrying out the invention have been described in detail, those familiar with the art to which this invention relates will recognize various alternative designs and embodiments for practicing the invention within the scope of the appended claims.

The invention claimed is:

1. A system comprising:
    a computing device having a host application and an analytical tool;
    wherein the host application is configured to present an interface to a user and allow the user to modify a component model, wherein the component model includes a three-dimensional representation of at least a portion of a vehicle component and has a virtual housing at least partially defining an internal cavity;
    wherein the analytical tool is configured to generate a solid body representing the internal cavity and calculate a volume of the solid body;
    wherein the analytical tool is configured to determine whether the internal cavity is bounded by the virtual housing of the component model;
    wherein the virtual housing presents at least one external face and wherein the component model includes at least one internal face at least partially defining the internal cavity;
    wherein the analytical tool is configured to prompt the user to select one of the external faces and one of the internal faces;
    wherein the analytical tool is configured to determine whether the internal cavity is bounded by the virtual housing by simulating a flow of fluid between the selected external face and the selected internal face, the simulated fluid flow being substantially similar to an actual fluid flow through the vehicle component; and
    wherein the analytical tool is configured to count a number of the external and internal faces traversed by the fluid during the simulated fluid flow, the fluid at least partially appearing on both of the external and internal faces traversed by the fluid.

2. The system as set forth in claim 1, wherein the analytical tool is configured to determine a shortest path between the selected external face and the selected internal face based at least in part on the number of external and internal faces traversed.

3. The system as set forth in claim 2, wherein the analytical tool is configured to determine that the internal cavity is bounded by the virtual housing if the number of external and internal faces traversed is zero.

4. The system as set forth in claim 1, wherein the component model includes a first subcomponent and a second subcomponent disposed within the virtual housing, and wherein the analytical tool is configured to determine whether the first subcomponent is disposed on the second subcomponent.

5. The system as set forth in claim 4, wherein the analytical tool is configured to generate a connector to connect the first and second subcomponents if the analytical tool determines that the first subcomponent is not disposed on the second subcomponent.

6. The system as set forth in claim 1, wherein the computing device includes a component library in communication with at least one of the host application and the analytical tool, and wherein the component library is configured to store the component model.

7. The system as set forth in claim 1, wherein at least one of the analytical tool and the host application are configured to receive instructions from the user via an input device and present at least one of the component model and the solid body to the user via an output device.

8. A method of determining a volume of a vehicle component, the method comprising:
    loading a component model into a host application, wherein the component model includes a three-dimensional representation of at least a portion of a vehicle component and has a virtual housing defining an internal cavity;
    determining, via an analytical tool, whether the internal cavity is bounded by the virtual housing;
    generating, via the analytical tool, a solid body representing the internal cavity if the internal cavity is bounded by the virtual housing;
    determining, via the analytical tool, a volume of the solid body;
    prompting a user to select at least one external face of the virtual housing;
    prompting the user to select at least one internal face of the component model that at least partially defines the internal cavity;
    wherein determining whether the internal cavity is bounded by the virtual housing includes simulating, via the analytical tool, a flow of fluid between the selected external face and the selected internal face, the simulated fluid flow being substantially similar to an actual fluid flow through the vehicle component; and
    wherein determining whether the internal cavity is bounded by the virtual housing includes counting a number of external and internal faces traversed by the fluid during the simulated fluid flow, the fluid at least partially appearing on both of the external and internal faces traversed by the fluid.

9. A method as set forth in claim 8, wherein determining whether the internal cavity is bounded by the virtual housing includes determining a shortest path between the selected external face and the selected internal face based at least in part on the number of external and internal faces traversed.

10. A method as set forth in claim 9, wherein determining whether the internal cavity is bounded by the virtual housing includes determining that the internal cavity is bounded by the virtual housing if the number of external and internal faces traversed is zero.

11. A method as set forth in claim 8, wherein the component model includes a first subcomponent and a second subcomponent disposed within the virtual housing, and further comprising determining, via the analytical tool, whether the first subcomponent is disposed on the second subcomponent.

12. A method as set forth in claim 11, further comprising generating a connector to connect the first and second subcomponents if the analytical tool determines that the first subcomponent is not disposed on the second subcomponent.

13. A system comprising:
    a computing device having a component library, a host application and an analytical tool;
    wherein the component library is configured to store a component model having a virtual housing at least partially defining an internal cavity and having a first subcomponent and a second subcomponent disposed within the virtual housing, wherein the component model includes a three-dimensional representation of at least a portion of a vehicle component;
    wherein the virtual housing presents at least one external face and wherein the component model includes at least one internal face at least partially defining the internal cavity;
    wherein the host application is in communication with the component library and configured to receive the component model from the component library, present an interface to a user, and allow the user to modify the component model;
    wherein the host application is configured to receive instructions from the user via an input device and present the component model to the user via an output device;
    wherein the analytical tool is configured to generate a solid body representing the internal cavity and calculate a volume of the solid body;
    wherein the analytical tool is configured to prompt the user to select one of the external faces and one of the internal faces and determine whether the internal cavity is bounded by the virtual housing by simulating a flow of fluid between the selected external face and the selected internal face such that the simulated fluid flow is substantially similar to an actual fluid flow through the vehicle component, counting a number of external and internal faces traversed by the fluid during the simulated fluid flow such that the fluid at least partially appears on both of the external and internal faces traversed by the fluid, and determining a shortest path between the selected external face and the selected internal face based at least in part on the number of external and internal faces traversed; and
    wherein the analytical tool is configured to determine whether the first subcomponent is disposed on the second subcomponent, and wherein the analytical tool is configured to generate a connector to connect the first and second subcomponents if the analytical tool determines that the first subcomponent is not disposed on the second subcomponent.

* * * * *